United States Patent
Nakano et al.

(10) Patent No.: US 11,165,419 B2
(45) Date of Patent: Nov. 2, 2021

(54) FAILURE DETECTION OF A SEMICONDUCTOR SWITCH USING FIRST AND SECOND CURRENT DETECTORS

(71) Applicant: TOSHIBA MITSUBISHI-ELECTRIC INDUSTRIAL SYSTEMS CORPORATION, Chuo-ku (JP)

(72) Inventors: Toshihide Nakano, Chuo-ku (JP); Kazuhiro Hinagata, Chiyoda-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 92 days.

(21) Appl. No.: 16/641,018

(22) PCT Filed: Aug. 22, 2017

(86) PCT No.: PCT/JP2017/029940
§ 371 (c)(1),
(2) Date: Feb. 21, 2020

(87) PCT Pub. No.: WO2019/038830
PCT Pub. Date: Feb. 28, 2019

(65) Prior Publication Data
US 2021/0036698 A1    Feb. 4, 2021

(51) Int. Cl.
*H02J 9/06* (2006.01)
*H03K 17/082* (2006.01)
*H03K 17/18* (2006.01)

(52) U.S. Cl.
CPC .......... *H03K 17/0824* (2013.01); *H02J 9/062* (2013.01); *H02J 9/068* (2020.01); *H03K 17/18* (2013.01)

(58) Field of Classification Search
CPC .......... H02J 9/068; H02J 9/062; H03K 17/18; H03K 17/0824
See application file for complete search history.

(56) References Cited

U.S. PATENT DOCUMENTS 5,075,628 A * 12/1991 Schuster .................. H02H 3/17
324/510
5,621,633 A * 4/1997 Tanomura ............. H02M 7/145
363/97

(Continued)

FOREIGN PATENT DOCUMENTS

JP    10-126980 A    5/1998

OTHER PUBLICATIONS

International Search Report dated Oct. 31, 2017 in PCT/JP2017/029940 filed on Aug. 22, 2017, 2 pages.

*Primary Examiner* — Harry R Behm
(74) *Attorney, Agent, or Firm* — Oblon, McClelland, Maier & Neustadt, L.L.P.

(57) ABSTRACT

A power supply system includes: a semiconductor switch (1) that is turned on at the time of normal supply from a commercial AC power supply (5); a first current detector (CT1) including a transformer (10) and configured to detect an AC input current (I1); a second current detector (CT2) including a Hall effect sensor (20) and configured to detect an AC output current (I2); and a failure detector (30) that determines that one of a pair of thyristors (1a, 1b) included in the semiconductor switch (1) has misfired when the detection values from the first and second current detectors (CT1, CT2) are not equal at the time of normal supply from the commercial AC power supply (5).

13 Claims, 9 Drawing Sheets

(56) References Cited

U.S. PATENT DOCUMENTS

| | | | |
|---|---|---|---|
| 2015/0042325 A1* | 2/2015 | Snoeij | G01R 19/0092 |
| | | | 324/251 |
| 2015/0091558 A1* | 4/2015 | Epps | G01R 15/18 |
| | | | 324/251 |
| 2015/0108833 A1* | 4/2015 | Ito | H02J 3/381 |
| | | | 307/23 |
| 2018/0152015 A1* | 5/2018 | Cheng | H02H 5/12 |

* cited by examiner

US 11,165,419 B2

FAILURE DETECTION OF A SEMICONDUCTOR SWITCH USING FIRST AND SECOND CURRENT DETECTORS

TECHNICAL FIELD

The present invention relates to a power supply system, particularly to a power supply system provided with a semiconductor switch including a pair of semiconductor elements.

BACKGROUND ART

For example, Japanese Patent Laying-Open No. 10-126980 (PTL 1) discloses an uninterruptible power supply system including: a semiconductor switch having a pair of thyristors connected in antiparallel between a commercial AC power supply and a load, the semiconductor switch being turned on at the time of normal supply from the commercial AC power supply; an inverter that supplies AC power to the load at the time of a power failure of the commercial AC power supply; two transformers, one of which detects the voltage of one of the terminals of the semiconductor switch, and the other of which detects the voltage of the other; and a failure detector that outputs a failure detection signal indicative of misfiring of any one of the pair of thyristors when the deviation between the secondary voltages of the two transformers goes out of a prescribed range.

CITATION LIST

Patent Literature

PTL 1: Japanese Patent Laying-Open No. 10-126980

SUMMARY OF INVENTION

Technical Problem

In PTL 1, however, the inclusion of two transformers for detecting misfiring of a thyristor causes an increase in size of the system.

Accordingly, a main object of the present invention is to provide a small-sized power supply system.

Solution to Problem

A power supply system according to the present invention includes: a semiconductor switch having a first terminal that receives AC power from a first AC power supply, and a second terminal connected to a load; and a first current detector and a second current detector each of which detects an instantaneous value of a current flowing through the semiconductor switch, and outputs a signal indicating a detection value. The semiconductor switch includes a first semiconductor element through which a current having a first polarity flows, and a second semiconductor element through which a current having a second polarity flows. The first current detector includes a transformer that outputs an electrical signal having a value corresponding to a current detected by the first current detector. The second current detector includes a magnetoelectric transducer that converts a magnetic field into an electrical signal, the magnetic field being generated by a current detected by the second current detector. The power supply system further includes a failure detector that, when the detection values from the first and second current detectors are not equal, outputs a failure detection signal indicating that a current is not flowing through any one of the first and second semiconductor elements.

Advantageous Effects of Invention

In the power supply system according to the present invention, a first current detector including a transformer detects a current flowing through a semiconductor switch, and a second current detector including a magnetoelectric transducer detects a current flowing through the semiconductor switch. When the detection values from the first and second current detectors are not equal, a failure detection signal is outputted. This allows downsizing of the system, as compared to a conventional system which requires two transformers for generating a failure detection signal.

DESCRIPTION OF EMBODIMENTS

Embodiment 1

Figure 1:
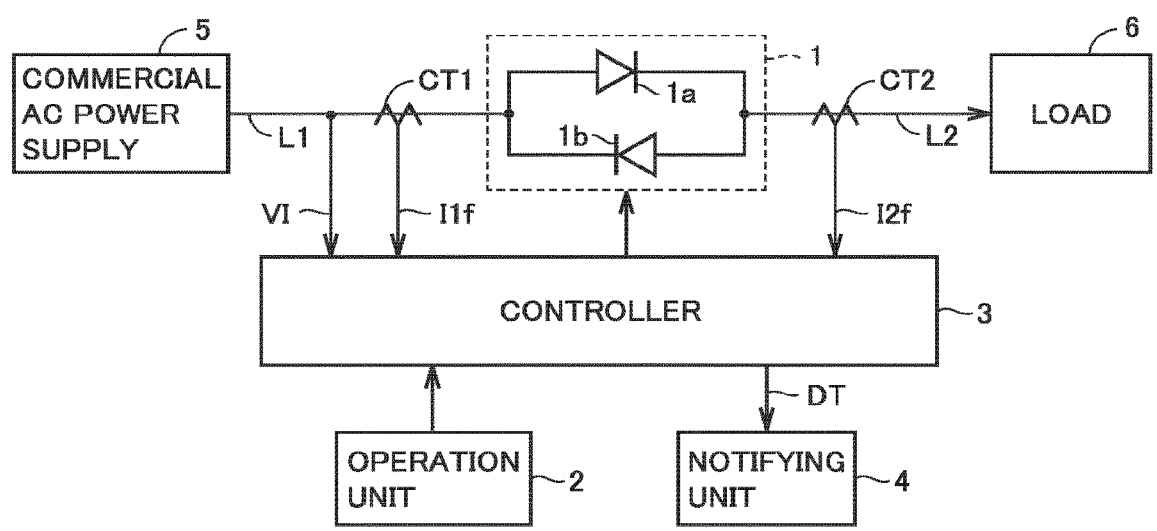
FIG. 1 is a circuit block diagram showing a configuration of a power supply system in embodiment 1 of the present invention.

FIG. 1 is a circuit block diagram showing a configuration of a power supply system in embodiment 1 of the present invention. In FIG. 1, this power supply system includes AC lines L1, L2, a semiconductor switch 1, an operation unit 2, a controller 3, and a notifying unit 4.

Semiconductor switch 1 has one terminal connected to a commercial AC power supply 5 via AC line L1, and the other terminal connected to a load 6 via AC line L2. Semiconductor switch 1 is controlled by controller 3 so that, when an AC voltage VI supplied from commercial AC power supply 5 is normal (at the time of normal supply from commercial AC power supply 5), semiconductor switch 1 is turned on; and when AC voltage VI supplied from commercial AC power supply 5 is not normal (at the time of a power failure of commercial AC power supply 5), semiconductor switch 1 is turned off.

Semiconductor switch 1 includes a pair of thyristors 1a, 1b connected in antiparallel to each other. Thyristor 1a (first semiconductor element) has an anode connected to one terminal of semiconductor switch 1, and a cathode connected to the other terminal of semiconductor switch 1. Thyristor 1b (second semiconductor element) has an anode and a cathode respectively connected to the cathode and the anode of thyristor 1a.

When AC voltage VI from commercial AC power supply 5 has a positive polarity, application of a trigger current to the gate of thyristor 1a causes thyristor 1a to be fired (turned on). When AC voltage VT becomes 0 V after that, thyristor 1a is extinguished (turned off). When AC voltage VI has a negative polarity, application of a trigger current to the gate of thyristor 1b causes thyristor 1b to be fired (turned on). When AC voltage VI becomes 0 V after that, thyristor 1b is extinguished (turned off).

When a trigger current is applied to the gates of thyristors 1a, 1b alternately in synchronization with AC voltage VI, thyristors 1a, 1b are alternately fired, thereby turning on semiconductor switch 1. When the supply of trigger current to the gates of thyristors 1a, 1b is stopped, thyristors 1a, 1b are extinguished, thereby turning off semiconductor switch 1.

The instantaneous value of AC voltage VI from commercial AC power supply 5 is detected by controller 3. The detection value of AC voltage VI is used to determine the presence or absence of a power failure in commercial AC power supply 5 and to control thyristors 1a, 1b. Current detector CT1 detects the instantaneous value of an AC input current I1 flowing through AC line L1, and provides a signal I1$f$ indicating the detection value to controller 3. Current detector CT2 detects the instantaneous value of an AC output current I2 flowing through AC line L2, and provides a signal I2$f$ indicating the detection value to controller 3.

Operation unit 2 includes, for example, a plurality of buttons to be operated by the user of the power supply system, and an image display that displays various pieces of information. The user can turn on and off semiconductor switch 1 by operating operation unit 2.

Controller 3 controls the overall power supply system based on, for example, the signal from operation unit 2, AC voltage VI, AC input current T1, and AC output current I2. Specifically, when controller 3 receives from operation unit 2 an OFF instruction signal for instructing turn-off of semiconductor switch 1, controller 3 turns off semiconductor switch 1.

When controller 3 receives from operation unit 2 an ON instruction signal for instructing turn-on of semiconductor switch 1, controller 3 determines whether or not a power failure of commercial AC power supply 5 has occurred, based on the detection value of AC voltage VI, and controls semiconductor switch 1 in synchronization with AC input voltage VI.

At the time of normal supply in which AC power is supplied from commercial AC power supply 5, controller 3 turns on semiconductor switch 1 in response to the ON instruction signal. At the time of a power failure in which the supply of AC power from commercial AC power supply 5 is stopped, controller 3 turns off semiconductor switch 1.

At the time of normal supply from commercial AC power supply 5, when AC input current I1 increases to above the upper limit, controller 3 determines that an overcurrent has flowed through load 6, and thus turns off semiconductor switch 1. At the time of normal supply from commercial AC power supply 5, when AC input current I1 decreases to below the lower limit, controller 3 determines that a pair of thyristors 1a, 1b included in semiconductor switch 1 have both misfired, and thus stops controlling semiconductor switch 1.

Further, at the time of normal supply from commercial AC power supply 5, controller 3 determines whether or not thyristors 1a, 1b are normally working, based on output signals I1$f$, I2$f$ (i.e., detection values) from current detectors CT1, CT2. When signals I1$f$, I2$f$ are equal, controller 3 determines that thyristors 1a, 1b are normally working, and thus sets a failure detection signal DT to the "L" level or inactive level. When signals I1$f$, I2$f$ are not equal, controller 3 determines that any one of a pair of thyristors 1a, 1b has misfired, and thus sets failure detection signal DT to the "H" level or active level.

When failure detection signal DT is set to the "H" level or active level, notifying unit 4 notifies to the user of the power supply system that any one of a pair of thyristors 1a, 1b has misfired (i.e., a current is not flowing through any one of thyristors 1a, 1b).

Figure 2:
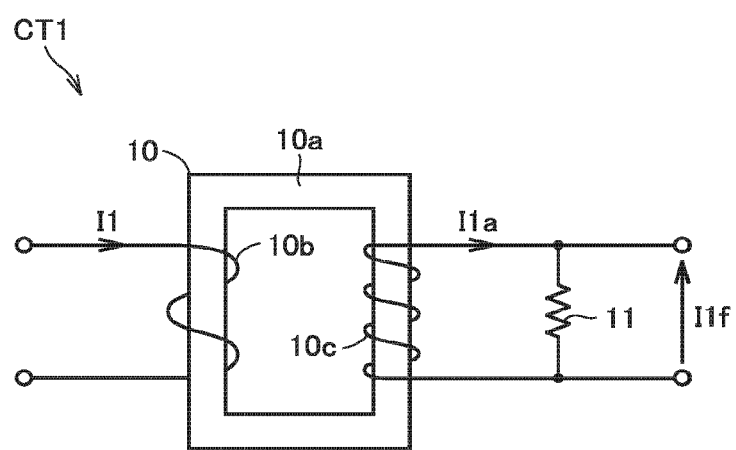
FIG. 2 is a diagram showing a principle configuration of current detector CT1 shown in FIG. 1.

A detailed description will now be given regarding a method for determining whether or not thyristors 1a, 1b are normally working based on output signals I1$f$, I2$f$ from current detectors CT1, CT2. FIG. 2 is a diagram showing a principle configuration of current detector CT1. In FIG. 2, current detector CT1, which is an AC current transformer (ACCT), includes a transformer 10 and a resistive element 11. Transformer 10 includes a ring-shaped iron core 10a and a primary winding 10b and secondary winding 10c wound around iron core 10a. Primary winding 10b constitutes a part of AC line L1, so that AC input current I1 flows through primary winding 10b.

The ratio n1/n2 between the number of turns n1 of primary winding 10b and the number of turns n2 of secondary winding 10c is set to a value sufficiently small. A current I1$a$ flowing through secondary winding 10c is n1/n2 of current T1 flowing through primary winding 10b (I1$a$=I1×n1/n2). Between the terminals of resistive element 11, signal I1$f$ appears that indicates a voltage having a value corresponding to AC input current I1. Specifically, the voltage value is R×I1×n1/n2, where R denotes the resistance value of resistive element 11. In this current detector CT1, when AC input current I1 is a sinusoidal AC current, signal I1$f$ has the same waveform as AC input current I1.

However, at the time of normal supply from commercial AC power supply 5, when only one of a pair of thyristors 1a, 1b has misfired, the current flowing through AC lines L1, L2 has only one of a positive polarity and a negative polarity. In this case, in current detector CT1, iron core 10a is magnetized in one direction, so that signal I1$f$ is different from AC input current I1 in waveform. The phenomenon in which iron core 10a is magnetized in one direction is called biased magnetization.

Figure 3:
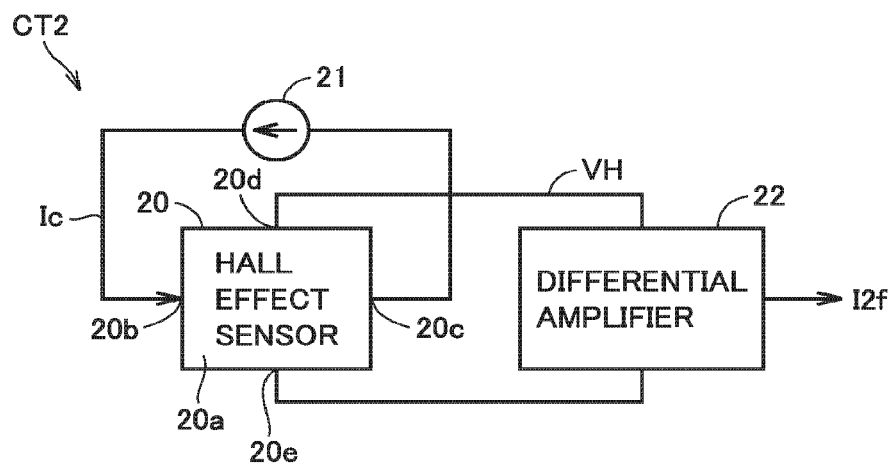
FIG. 3 is a diagram showing a principle configuration of current detector CT2 shown in FIG. 1.

FIG. 3 is a diagram showing a principle configuration of current detector CT2. In FIG. 3, current detector CT2, which is a Hall current transformer (HCT), includes a Hall effect sensor 20, a constant-current source 21, and a differential amplifier 22.

Hall effect sensor 20 is a magnetoelectric transducer that converts a magnetic field intensity into an electrical signal using the Hall effect. Hall effect sensor 20 includes a rectangular semiconductor chip 20a, a pair of current terminals 20b, 20c provided on the two end faces of semiconductor chip 20a opposite to each other, and a pair of voltage terminals 20d, 20e provided on the other two end faces. Hall effect sensor 20 is disposed near AC line L2 so that a magnetic flux generated around AC line L2 lies in the direction perpendicular to the surface of semiconductor chip 20a (i.e., the direction perpendicular to the drawing sheet).

Constant-current source 21 applies a constant control current Ic between current terminals 20b, 20c of Hall effect sensor 20. When AC output current I2 flows through AC line L2, a magnetic field is generated around AC line L2, the magnetic field having an intensity corresponding to the value of AC output current I2. Between voltage terminals 20d, 20e of Hall effect sensor 20, a voltage VH proportional to the magnetic flux density is outputted. Specifically, VH=K×Ic×B is satisfied where B denotes the magnetic flux density, and K denotes a constant. Differential amplifier 22 amplifies output voltage VH from Hall effect sensor 20 and outputs signal I2f.

Output signal I2f from current detector CT2 has the same waveform as AC input current I2. Constant K of Hall effect sensor 20, control current Ic, the amplification factor of differential amplifier 22, ratio n1/n2 of transformer 10, resistance value R of resistive element 11, and other parameters are set in such a way that output signals I1f, I2f from two current detectors CT1, CT2 are the same level when the AC currents flowing through AC lines L1, L2 have the same value.

Accordingly, at the time of normal supply from commercial AC power supply 5, when a pair of thyristors 1a, 1b of semiconductor switch 1 are normally working, an AC current flows through AC lines L1, L2 and output signals I1f, I2f from current detectors CT1, CT2 have the same waveform. However, at the time of normal supply from commercial AC power supply 5, when only one of a pair of thyristors 1a, 1b has misfired, output signals I1f, I2f from current detectors CT1, CT2 no longer have the same waveform. Accordingly, in embodiment 1, whether or not thyristors 1a, 1b of semiconductor switch 1 are normally working is determined based on a voltage Vs of the difference between output signals I1f, I2f from current detectors CT1, CT2 (Vs=I1f−I2f).

Figure 4:
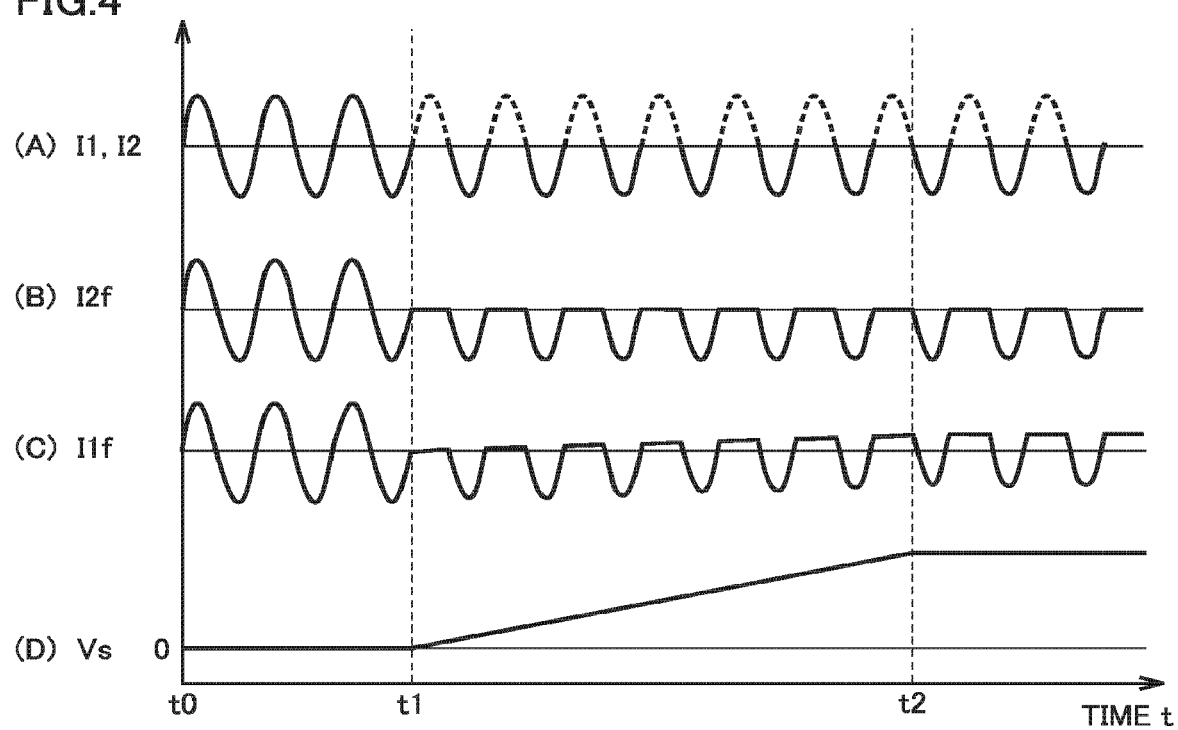
FIG. 4 is a time chart illustrating the principle of the present invention.

FIG. 4 (A) to (D) is a time chart illustrating the principle of the present invention. Specifically, FIG. 4 (A) shows the waveform of AC input current I1 and AC output current I2, FIG. 4 (B) shows the waveform of output signal I2f from current detector CT2, FIG. 4 (C) shows the waveform of output signal I1f from current detector CT1, and FIG. 4 (D) shows voltage Vs of the difference between signal I1f and signal I2f (Vs=I1f−I2f).

At the time of normal supply from commercial AC power supply 5, in the term when thyristors 1a, 1b of semiconductor switch 1 are normally working (t0 to t1), a current flows through thyristor 1a during the periods when AC voltage VI has a positive polarity, and flows through thyristor 1b during the periods when AC voltage VT has a negative polarity. Accordingly, as shown in FIG. 4 (A), AC current I1, I2 varies sinusoidally.

In this term (t0 to t1), as shown in FIG. 4 (B), output signal I2f from current detector CT2 varies sinusoidally, along with AC output current I2. In iron core 10a of current detector CT1, magnetic fluxes in the positive and negative directions alternately appear, and thus biased magnetization does not occur in iron core 10a. Accordingly, as shown in FIG. 4 (C), output signal I1f from current detector CT1 varies sinusoidally, along with AC input current I1. Therefore, as shown in FIG. 4 (D), voltage Vs of the difference between signal T1f and signal I2f (Vs=I1f−I2f) is maintained at 0 V.

At the time of normal supply from commercial AC power supply 5, in the term when only thyristor 1a of thyristors 1a, 1b of semiconductor switch 1 has misfired (after t1), a current does not flow through semiconductor switch 1 during the periods when AC voltage VI has a positive polarity, and flows through thyristor 1b during the periods when AC voltage VI has a negative polarity. Thus, as shown in FIG. 4 (A), AC current I1, I2 has a negative-polarity half-wave rectified waveform (i.e., a waveform representing only a negative-polarity current of the sinusoidal AC current).

In this term (after t1), as shown in FIG. 4 (B), output signal I2f from current detector CT2 has a negative-polarity half-wave rectified waveform, along with AC output current I2. In iron core 10a of current detector CT1, a magnetic flux appears only in the negative direction, and thus biased magnetization occurs in iron core 10a, resulting in a gradual increase in a negative-direction residual magnetic flux in iron core 10a. Accordingly, as shown in FIG. 4 (C), output signal I1f from current detector CT1 has a waveform obtained by adding a positive DC component to the negative-polarity half-wave rectified waveform, with the DC component gradually increasing. Therefore, as shown in FIG. 4 (D), voltage Vs of the difference between signal I1f and signal I2f (Vs=I1f−I2f) gradually increases in the positive direction from time t1. In the waveform of output signal I1f from current detector CT1 shown in FIG. 4 (C), after the positive-polarity current and the negative-polarity current reach equilibrium (after t2), voltage Vs of the difference between signal I1f and signal I2f (Vs=I1f−I2f) is constant as shown in FIG. 4 (D).

Accordingly, in embodiment 1, it is determined that thyristor 1a of thyristors 1a, 1b of semiconductor switch 1 has misfired when voltage Vs of the difference between signal I1f and signal I2f (Vs=I1f−I2f) increases to above a positive threshold voltage VTP.

On the other hand, when only thyristor 1b of thyristors 1a, 1b has misfired, AC current I1, I2 has a positive-polarity half-wave rectified waveform (i.e., a waveform representing only a positive-polarity current of the sinusoidal AC current). Output signal I2f from current detector CT2 has a positive-polarity half-wave rectified waveform, along with AC output current I2. Output signal I1f from current detector CT1 has a waveform obtained by adding a negative DC component to the positive-polarity half-wave rectified waveform, with the DC component gradually increasing in the negative direction. Therefore, voltage Vs of the difference between signal I1f and signal I2f (Vs=I1f−I2f) gradually increases in the negative direction.

Accordingly, in embodiment 1, it is determined that thyristor 1b of thyristors 1a, 1b of semiconductor switch 1 has misfired when voltage Vs of the difference between signal I1f and signal I2f (Vs=I1f−I2f) decreases to below a negative threshold voltage VTN.

Figure 5:
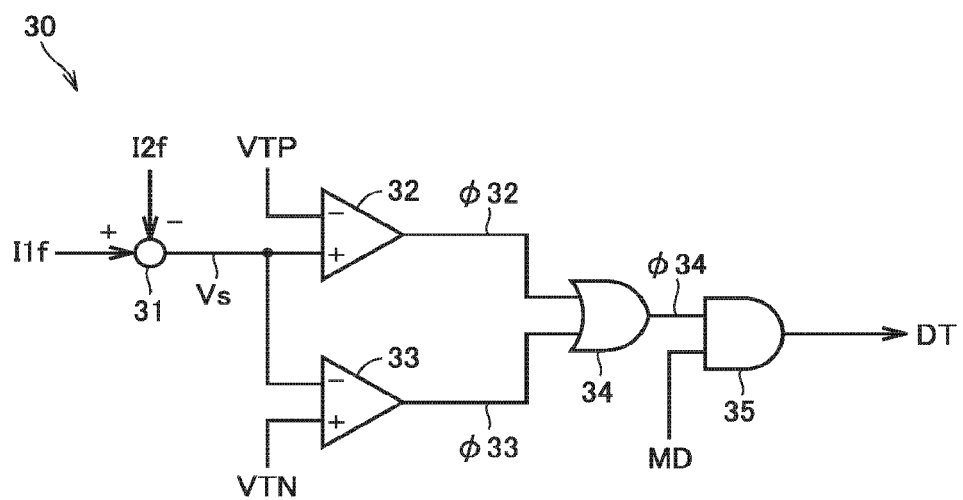
FIG. 5 is a circuit diagram showing a configuration of a failure detector included in the controller shown in FIG. 1.

FIG. 5 is a circuit diagram showing a configuration of a failure detector 30 included in controller 3 shown in FIG. 1. In FIG. 5, failure detector 30 includes a subtractor 31, comparators 32, 33, an OR gate 34, and an AND gate 35. Subtractor 31 calculates voltage Vs of the difference between signal I1f and signal I2f (Vs=I1f−I2f). Comparator 32 compares voltage Vs with positive threshold voltage VTP, and outputs a signal φ32 indicating the comparison result. Signal φ32 is set to the "L" level when Vs<VTP is satisfied, and is set to the "H" level when Vs>VTP is satisfied.

Comparator 33 compares voltage Vs with negative threshold voltage VTN, and outputs a signal φ33 indicating the comparison result. Signal φ33 is set to the "L" level when Vs>VTN is satisfied, and is set to the "H" level when Vs<VTN is satisfied.

OR gate 34 outputs a signal φ34 indicating the logical OR of output signal φ32 from comparator 32 and output signal φ33 from comparator 33. AND gate 35 outputs failure detection signal DT which is a signal indicating the logical AND of output signal φ34 from OR gate 34 and a mode signal MD. Mode signal MD is a signal which is set to the "H" level at the time of normal supply from commercial AC power supply 5 and to the "L" level at the time of a power failure of commercial AC power supply 5. Accordingly, at the time of a power failure of commercial AC power supply 5, failure detection signal DT is fixed to the "L" level or inactive level.

At the time of normal supply from commercial AC power supply 5, when thyristors 1a, 1b of semiconductor switch 1 are normally working, biased magnetization does not occur in transformer 10 (FIG. 2) and I1f=I2f is satisfied. That is, Vs=0 is satisfied. Therefore, output signals φ32, φ33 from comparators 32, 33 are both set to the "L" level, output signal φ34 from OR gate 34 is set to the "L" level, and failure detection signal DT is set to the "L" level or inactive level.

When thyristor 1a of thyristors 1a, 1b of semiconductor switch 1 has misfired, biased magnetization occurs in transformer 10, resulting in I1f>I2f as shown in FIGS. 4 (B) and (C). When Vs>VTP is satisfied, then output signals φ32, φ33 from comparators 32, 33 are respectively set to the "H" level and the "L" level, and output signal φ34 from OR gate 34 is set to the "H" level. Since mode signal MID is set to the "H" level, failure detection signal DT is set to the "H" level or active level.

When thyristor 1b of thyristors 1a, 1b of semiconductor switch 1 has misfired, biased magnetization occurs in transformer 10, resulting in I1f<I2f. When Vs<VTN is satisfied, then output signals φ32, φ33 from comparators 32, 33 are respectively set to the "L" level and the "H" level, and output signal φ34 from OR gate 34 is set to the "H" level. Since mode signal MID is set to the "H" level, failure detection signal DT is set to the "H" level or active level. Failure detection signal DT is provided to notifying unit 4 (FIG. 1).

When failure detection signal DT is set to the "H" level or active level, notifying unit 4 notifies to the user of the power supply system that any one of a pair of thyristors 1a, 1b of semiconductor switch 1 has misfired, using sound, light, image, text, and the like.

With threshold voltages VTP, VTN being set to sufficiently small values, when output signal I1f from current detector CT1 (i.e., the detection value from current detector CT1) is not equal to output signal I2f from current detector CT2 (i.e., the detection value from current detector CT2), failure detector 30 determines that any one of a pair of thyristors 1a, 1b of semiconductor switch 1 has misfired.

The operation of the power supply system will now be described. At the time of normal supply from commercial AC power supply 5, when controller 3 receives an ON instruction signal in response to the user of the power supply system operating operation unit 2, controller 3 alternately fires thyristors 1a, 1b in synchronization with AC voltage VI from commercial AC power supply 5, thereby turning on semiconductor switch 1.

When thyristors 1a, 1b of semiconductor switch 1 are normally working, AC power is supplied from commercial AC power supply 5 to load 6 via semiconductor switch 1, so that load 6 is operated.

When at least one of thyristors 1a, 1b of semiconductor switch 1 has misfired, biased magnetization occurs in iron core 10a of transformer 10 included in current detector CT1 (FIG. 2), resulting in an increase in the absolute value of voltage Vs of the difference between output signals I1f, I2f from current detectors CT1, CT2 (FIG. 4 (A) to (D)). When Vs>VTP or Vs<VTN is satisfied, failure detector 30 (FIG. 5) sets failure detection signal DT to the "H" level or active level.

When failure detection signal DT is set to the "H" level, notifying unit 4 notifies to the user of the power supply system that any one of thyristors 1a, 1b has misfired. The user of the power supply system can stop the operation of load 6 by operating operation unit 2 to turn off semiconductor switch 1. The user of the power supply system can examine the cause of misfiring of any one of thyristors 1a, 1b. If identifying a breakage of semiconductor switch 1 as the cause, the user can replace the broken semiconductor switch 1 with a new one.

When any one of thyristors 1a, 1b has misfired but it does not affect the operation of load 6, the user of the power supply system can maintain the state as it is. The user of the power supply system can examine the cause of misfiring of any one of thyristors 1a, 1b, at the time of maintenance. If identifying a breakage of semiconductor switch 1 as the cause, the user can replace the broken semiconductor switch 1 with a new one. At the time of a power failure of commercial AC power supply 5, controller 3 turns off semiconductor switch 1, so that the operation of load 6 is stopped.

As described above, in embodiment 1, whether or not thyristors 1a, 1b of semiconductor switch 1 have misfired is determined based on voltage Vs of the difference between output signals I1f, I2f from current detectors CT1, CT2. This allows downsizing of the system, as compared to a conventional system which requires two transformers for detecting misfiring of a thyristor.

In embodiment 1, current detectors CT1, CT2 detect currents in AC line L1 and AC line L2, respectively. However, this is not mandatory. Current detectors CT1, CT2 may be located at any place if they can detect the current flowing through semiconductor switch 1. For example, both of current detectors CT1, CT2 may detect the current in AC line L1, or both of current detectors CT1, CT2 may detect the current in AC line L2, or current detectors CT1, CT2 may respectively detect the currents in AC line L2 and AC line L1.

In embodiment 1, when any one of thyristors 1a, 1b has misfired, the user of the power supply system operates operation unit 2 so as to maintain the state as it is or turn off semiconductor switch 1. However, when failure detection signal DT is set to the "H" level or active level, controller 3 may turn off semiconductor switch 1.

Embodiment 2

Figure 6:
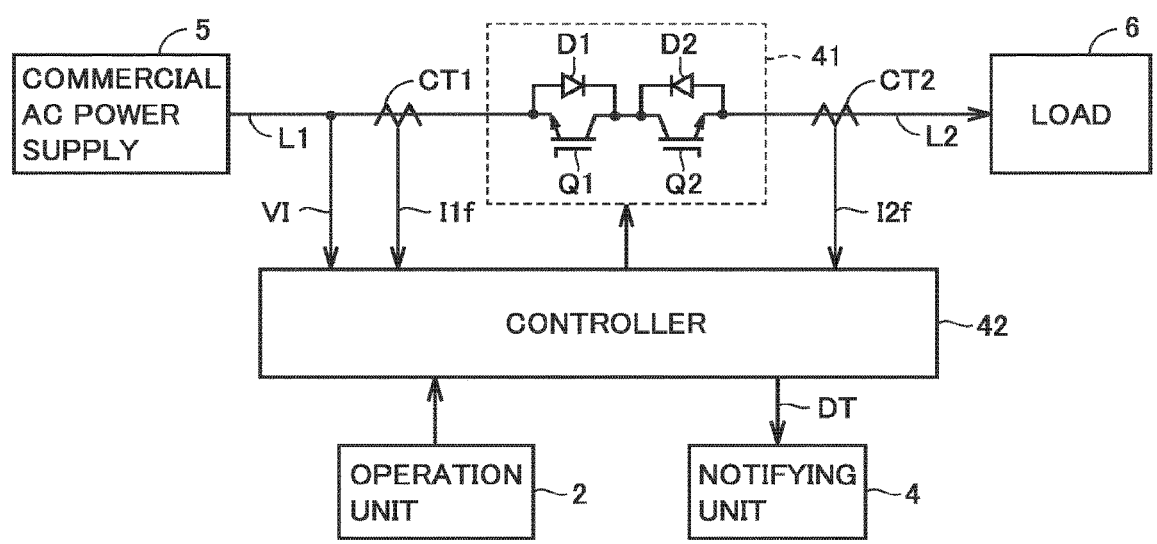
FIG. 6 is a circuit block diagram showing a configuration of a power supply system in embodiment 2 of the present invention.

FIG. 6 is a circuit block diagram showing a configuration of a power supply system in embodiment 2 of the present invention, FIG. 6 being comparable to FIG. 1. With reference to FIG. 6, this power supply system is different from the power supply system in embodiment 1 in that it includes a semiconductor switch 41 instead of semiconductor switch 1, and a controller 42 instead of controller 3.

Semiconductor switch 1 includes insulated gate bipolar transistors (IGBTs) Q1, Q2 and diodes D1, D2. IGBTs Q1, Q2 have their respective collectors connected to each other, and have their respective gates connected to controller 42. IGBT Q1 (first semiconductor element) has an emitter connected to commercial AC power supply 5 via AC line L1. IGBT Q2 (second semiconductor element) has an emitter connected to load 6 via AC line L2.

Diode D1 has an anode and a cathode respectively connected to the emitter and the collector of IGBT Q1. Diode D2 has an anode and a cathode respectively connected to the emitter and the collector of IGBT Q2. That is, diodes D1, D2 are connected in antiparallel to IGBTs Q1, Q2, respectively.

Controller 42 is different from controller 3 (FIG. 1) in that controller 42 turns on and off each of IGBTs Q1, Q2 in synchronization with AC voltage VI, instead of firing thyristors 1a, 1b in synchronization with AC voltage VI.

Specifically, when AC voltage VI is a positive voltage, controller 42 sets the gate of IGBT Q2 to the "H" level to turn on IGBT Q2. In this case, a positive current flows from commercial AC power supply 5 to load 6 via diode D1 and IGBT Q2. When AC voltage VI is a negative voltage, controller 42 sets the gate of IGBT Q1 to the "H" level to turn on IGBT Q1. In this case, a negative current flows from commercial AC power supply 5 to load 6 via IGBT Q1 and diode D2.

Controller 42 includes failure detector 30 (FIG. 5) to determine whether or not IGBTs Q1, Q2 are normally working at the time of normal supply from commercial AC power supply 5, based on output signals I1f, I2f (i.e., the detection values) from current detectors CT1, CT2.

When signals I1f, I2f are equal, controller 42 determines that IGBTs Q1, Q2 are normally working, and thus sets failure detection signal DT to the "L" level or inactive level. When signals I1f, I2f are not equal, controller 42 determines that a current is not flowing through any one of a pair of IGBTs Q1, Q2 and thus sets failure detection signal DT to the "H" level or active level.

When failure detection signal DT is set to the "H" level or active level, notifying unit 4 notifies to the user of the power supply system that any one of a pair of IGBTs Q1, Q2 has not turned on (i.e., a current is not flowing through any one of IGBTs Q1, Q2).

The user of the power supply system can stop the operation of load 6 by operating operation unit 2 to turn off semiconductor switch 41. The user of the power supply system can examine the cause of failure of any one of IGBTs Q1, Q2 to turn on. If identifying a breakage of semiconductor switch 41 as the cause, the user can replace the broken semiconductor switch 41 with a new one.

When any one of IGBTs Q1, Q2 does not turn on but it does not affect the operation of load 6, the user of the power supply system can maintain the state as it is. The user of the power supply system can examine the cause of failure of any one of IGBTs Q1, Q2 to turn on, at the time of maintenance. If identifying a breakage of semiconductor switch 41 as the cause, the user can replace the broken semiconductor switch 41 with a new one. At the time of a power failure of commercial AC power supply 5, controller 42 turns off semiconductor switch 41, so that the operation of load 6 is stopped.

The other configuration and operation are the same as those of embodiment 1, and thus the redundant description is not repeated. Embodiment 2 can bring about the same advantageous effects as those of embodiment 1.

Figure 7:
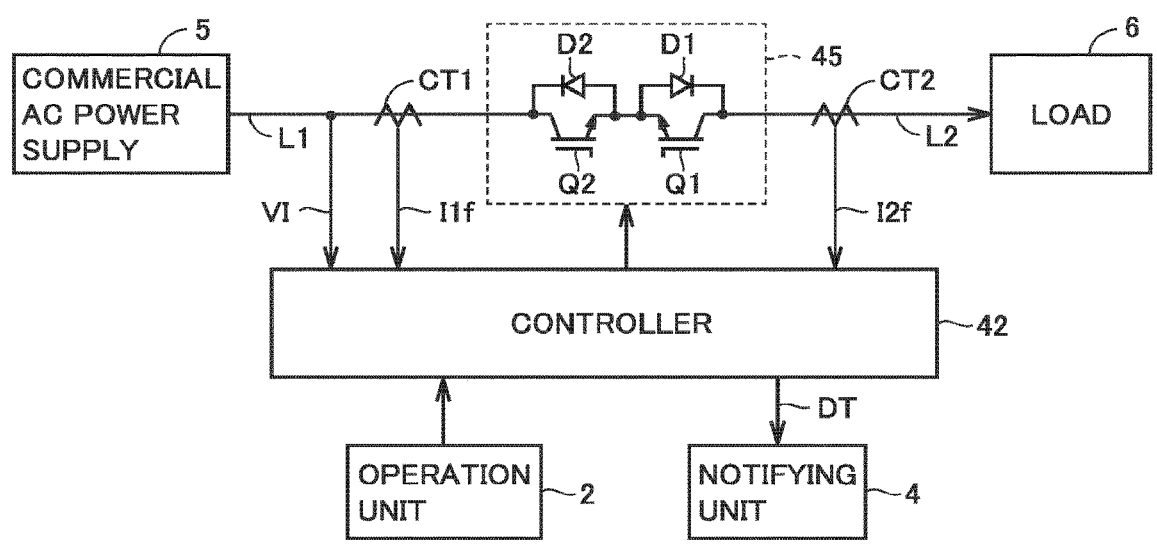
FIG. 7 is a circuit block diagram showing a variation of embodiment 2.

FIG. 7 is a circuit block diagram showing a variation of embodiment 2, FIG. 7 being comparable to FIG. 6. With reference to FIG. 7, this power supply system is different from the power supply system in FIG. 6 in that it includes a semiconductor switch 45 instead of semiconductor switch 41.

Semiconductor switch 45 includes IGBTs Q1, Q2 and diodes D1, D2. IGBTs Q1, Q2 have their respective emitters connected to each other, and have their respective gates connected to controller 42. IGBT Q2 has a collector connected to commercial AC power supply 5 via AC line L1. IGBT Q1 has an emitter connected to load 6 via AC line L2. Diode D1 has an anode and a cathode respectively connected to the emitter and the collector of IGBT Q1. Diode D2 has an anode and a cathode respectively connected to the emitter and the collector of IGBT Q2. That is, diodes D1, D2 are connected in antiparallel to IGBTs Q1, Q2, respectively.

When AC voltage VI is a positive voltage, controller 42 sets the gate of IGBT Q2 to the "H" level to turn on IGBT Q2. In this case, a positive current flows from commercial AC power supply 5 to load 6 via IGBT Q2 and diode D1. When AC voltage VI is a negative voltage, controller 42 sets the gate of IGBT Q1 to the "H" level to turn on IGBT Q1. In this case, a negative current flows from commercial AC power supply 5 to load 6 via diode D2 and IGBT Q1.

The other configuration and operation are the same as those of embodiment 2, and thus the redundant description is not repeated. This variation can bring about the same advantageous effects as those of embodiment 2.

Embodiment 3

Figure 8:
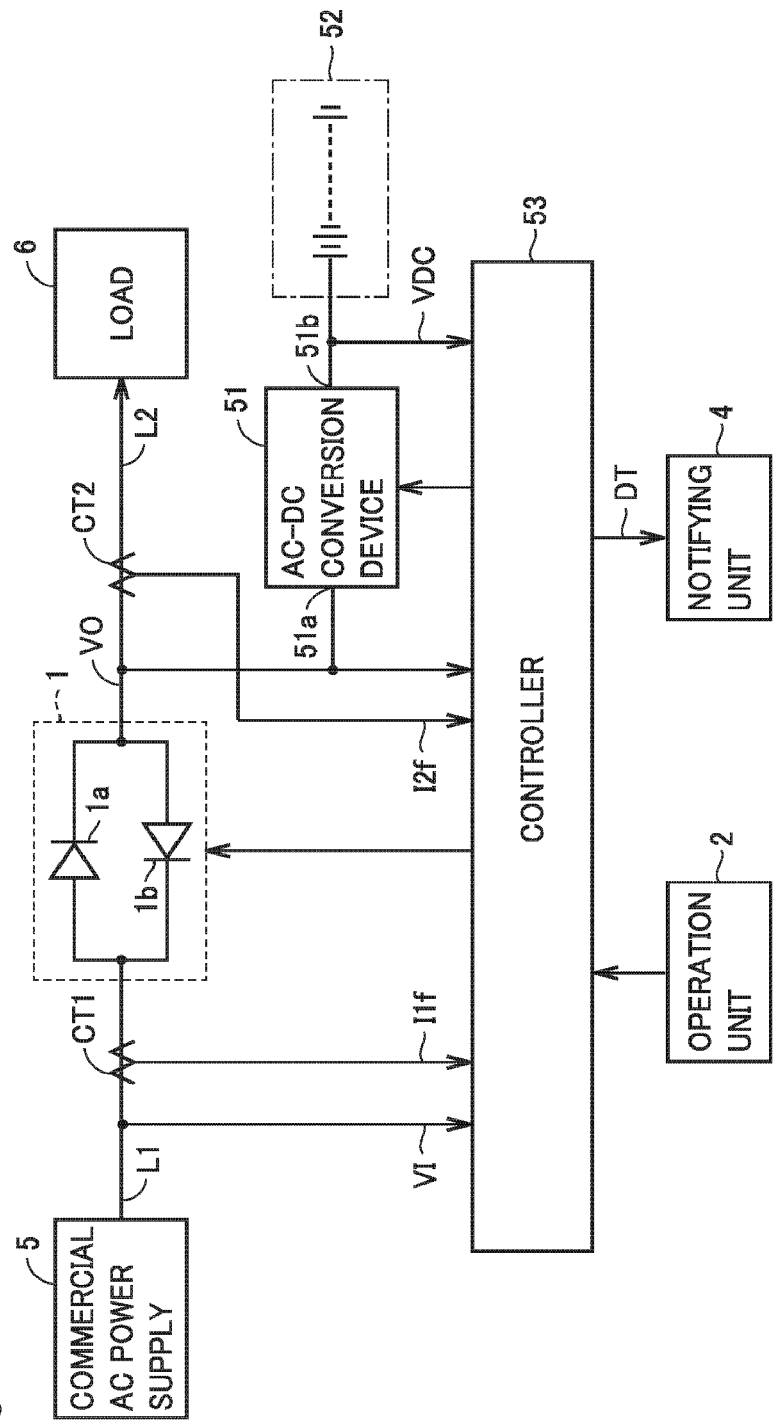
FIG. 8 is a circuit block diagram showing a configuration of a voltage sag compensator in embodiment 3 of the present invention.

FIG. 8 is a circuit block diagram showing a configuration of a voltage sag (instantaneous voltage drop) compensator in embodiment 3 of the present invention, FIG. 8 being comparable to FIG. 1. The instantaneous voltage drop refers to a drop of AC voltage VI from commercial AC power supply 5 for a short time (e.g., less than one second) due to an accident (e.g., lightning). The power failure refers to a stop of supply of AC voltage VI from commercial AC power supply 5 for a lone time (e.g., one second of more) due to an accident (e.g., lightning).

With reference to FIG. 8, this voltage sag compensator is different from the power supply system in FIG. 1 in that it additionally includes an AC-DC conversion device 51 and a battery 52 (power storage unit), and in that it includes a controller 53 instead of controller 3. AC-DC conversion device 51 has an AC terminal 51a connected to the other terminal of semiconductor switch 1, and a DC terminal 51b connected to battery 52. Battery 52 stores DC power. Instead of battery 52, a capacitor may be connected.

AC-DC conversion device 51 is controlled by controller 53 so that, when AC voltage VI from commercial AC power supply 5 is normal, AC-DC conversion device 51 converts AC power supplied from commercial AC power supply 5 via semiconductor switch 1 into DC power, and supplies the DC power to battery 52 for storage therein. At this time, AC-DC conversion device 51 charges battery 52 so that a voltage VDC between the terminals of battery 52 will be a prescribed target DC voltage VDCT.

When AC voltage VI from commercial AC power supply 5 decreases to below the lower limit (at the time of voltage sag), AC-DC conversion device 51 converts DC power from battery 52 into AC power having a commercial frequency, and supplies the AC power to load 6 via AC line L2. At this time, AC-DC conversion device 51 outputs AC current I2 so that AC output voltage VO will be a prescribed target AC voltage VOT.

Controller 53 controls the overall voltage sag compensator based on AC input voltage VI, AC input current I1, AC output voltage VO, AC output current I2, and voltage VDC between the terminals of battery 52. Controller 53 is different from controller 3 in FIG. 1 in that controller 53 controls AC-DC conversion device 51 based on AC input voltage VI, AC output voltage VO, AC output current I2, and voltage VDC between the terminals of battery 52.

Specifically, when AC voltage VI from commercial AC power supply 5 is normal, controller 53 turns on semiconductor switch 1, and controls AC-DC conversion device 51 to charge battery 52 so that voltage VDC between the terminals of battery 52 will be prescribed target DC voltage VDCT.

When AC voltage VI from commercial AC power supply 5 decreases to below the lower limit (at the time of voltage sag), controller 53 turns off semiconductor switch 1, and controls AC output current I2 of AC-DC conversion device 51 based on output signal I2f from current detector CT2 so that AC output voltage VO will be prescribed target AC voltage VOT.

Further, controller 53 includes failure detector 30 (FIG. 5). At the time of normal operation of the voltage sag compensator, mode signal MD (FIG. 5) is set to the "H" level when AC voltage VI from commercial AC power supply 5 is normal, and to the "L" level when a voltage sag occurs. If initial charging of battery 52 is performed at the beginning of the use of battery 52, mode signal MD is set to the "L" level.

When mode signal MD is set to the "L" level, failure detection signal DT is fixed to the "L" level or inactive level. In the term during which mode signal MD is set to the "H" level, when voltage Vs of the difference between output signals I1f, I2f from current detectors CT1, CT2 (Vs=I1f−I2f) goes out of a normal range VTN to VTP, failure detection signal DT is set to the "H" level or active level.

Specifically, if initial charging of battery 52 is performed at the beginning of the use of battery 52 (MD=L), a high current flows from commercial AC power supply 5 to battery 52 via semiconductor switch 1 and AC-DC conversion device 51, so that voltage Vs of the difference between output signals I1f, I2f from current detectors CT1, CT2 (Vs=I1f−I2f) goes out of the normal range VTN to VTP. However, during the term of the initial charging of battery 52, mode signal MD is set to the "L" level, and thus failure detection signal DT is set to the "L" level or inactive level.

At the time of normal operation of the voltage sag compensator, when AC voltage VI from commercial AC power supply 5 is normal (MD=H), a current flows from commercial AC power supply 5 to battery 52 via semiconductor switch 1 and AC-DC conversion device 51. Accordingly, voltage Vs of the difference between output signals I1f, I2f from current detectors CT1, CT2 (Vs=I1f−I2f) arises. However, since the current flowing through battery 52 at this time is much lower than the current flowing through load 6, voltage Vs of the difference falls within the normal range VTN to VTP, so that failure detection signal DT is set to the "L" level or inactive level.

In this case (MD=H), when any one of a pair of thyristors 1a, 1b included in semiconductor switch 1 has misfired, voltage Vs of the difference between output signals I1f, I2f from current detectors CT1, CT2 (Vs=I1f−I2f) goes out of the normal range VTN to VTP, so that failure detection signal DT is set to the "H" level or active level.

The operation of this voltage sag compensator will now be described. When AC voltage VI from commercial AC power supply 5 is normal, semiconductor switch 1 is turned on, and AC power is supplied from commercial AC power supply 5 to load 6 via semiconductor switch 1, so that load 6 is driven. Also, AC power is supplied from commercial AC power supply 5 to AC-DC conversion device 51 via semiconductor switch 1, so that the AC power is converted into DC power to be stored in battery 52.

In this case, when any one of a pair of thyristors 1a, 1b included in semiconductor switch 1 has misfired, failure detection signal DT is set to the "H" level or active level. Further, notifying unit 4 notifies to the user of the voltage sag compensator that the thyristor has misfired.

When AC voltage VI from commercial AC power supply 5 decreases to below the lower limit, then semiconductor switch 1 is turned off, and AC-DC conversion device 51 converts DC power from battery 52 into AC power having a commercial frequency and supplies the AC power to load 6. Thus, the operation of load 6 is continued.

When AC voltage VI from commercial AC power supply 5 recovers to normal, then semiconductor switch 1 is turned on again, and AC power is supplied from commercial AC power supply 5 to load 6 via semiconductor switch 1, so that load 6 is driven. Also, AC power is supplied from commercial AC power supply 5 to AC-DC conversion device 51 via semiconductor switch 1, and the AC power is converted into DC power to be stored in battery 52.

The other configuration and operation are the same as those of embodiment 1, and thus the redundant description is not repeated. Embodiment 3 can bring about the same advantageous effects as those of embodiment 1.

Current detector CT2 is preferably used as a current detector for controlling the AC output current of AC-DC conversion device 51 at the time of voltage sag. This is because current detector CT2 (HCT), free from biased magnetization, can more accurately detect the current than current detector CT1 (ACCT) having possible biased magnetization. Therefore, current detector CT2 is preferably used to detect the current in AC line L2.

Embodiment 4

Figure 9:
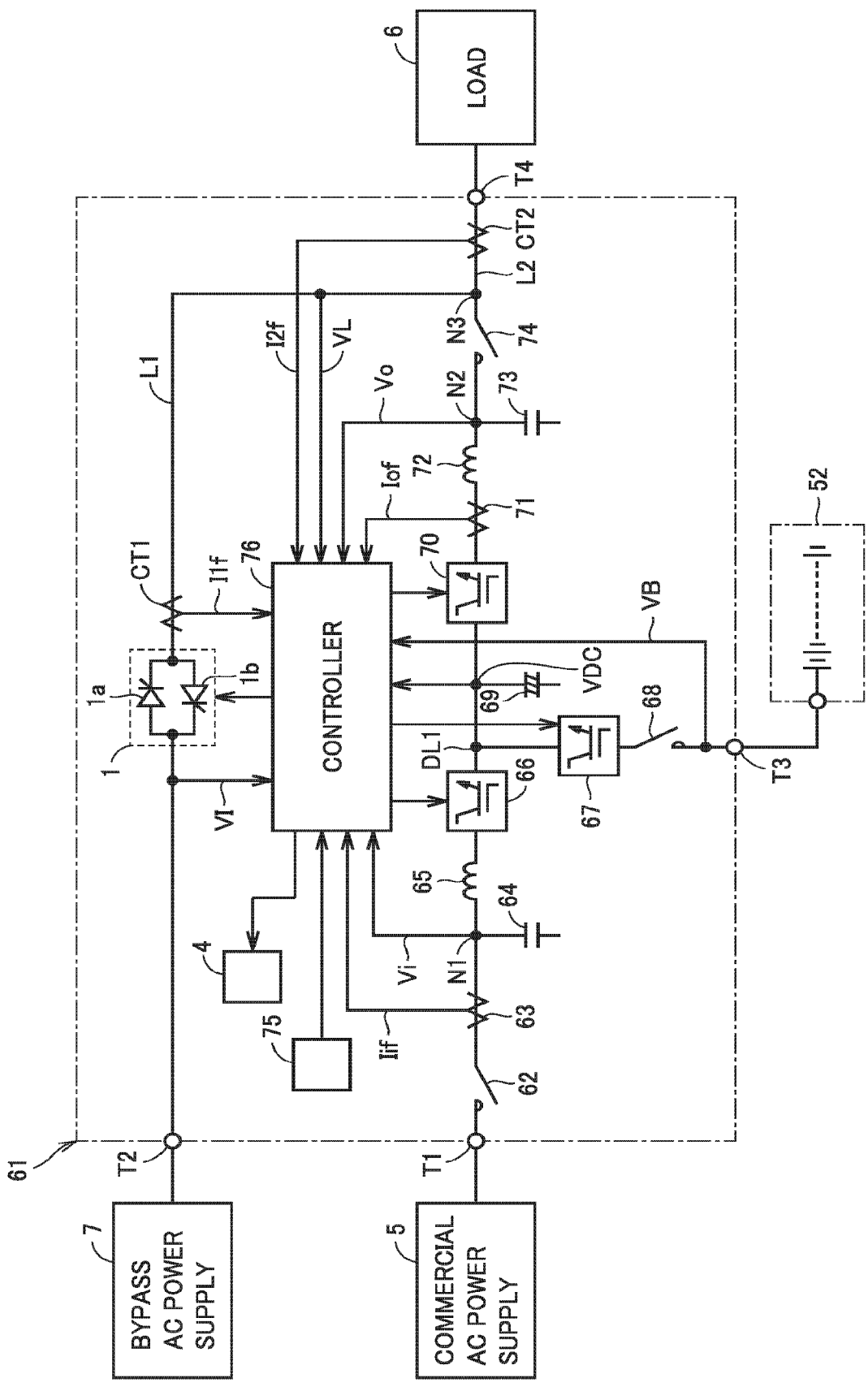
FIG. 9 is a circuit block diagram showing a configuration of an uninterruptible power supply system in embodiment 4 of the present invention.

FIG. 9 is a circuit block diagram showing a configuration of an uninterruptible power supply system 61 in embodiment 4 of the present invention. At the time of normal supply in which three-phase AC power is normally supplied from a bypass AC power supply 7 (first AC power supply), uninterruptible power supply system 61 supplies three-phase AC power from bypass AC power supply 7 to load 6 via semiconductor switch 1. At the time of a power failure in which the supply of three-phase AC power from bypass AC power supply 7 is stopped, uninterruptible power supply system 61 supplies three-phase AC power generated by an inverter 70 to load 6. For simplicity of the drawing and illustration, FIG. 9 shows a circuit for only a single phase (e.g., U phase) of the three phases (U, V, and W phases).

In FIG. 9, uninterruptible power supply system 61 includes an AC input terminal T1, a bypass input terminal T2, a battery terminal T3, and an AC output terminal T4. AC input terminal T1 receives AC power having a commercial frequency from commercial AC power supply 5 (second AC power supply). Bypass input terminal T2 receives AC power having a commercial frequency from bypass AC power supply 7. Bypass AC power supply 7 may be a commercial AC power supply or may be a private electric generator.

Battery terminal T3 is connected to battery 52 (power storage unit). Battery 52 stores DC power. Instead of battery 52, a capacitor may be connected. AC output terminal T4 is connected to load 6. Load 6 is driven by AC power.

Uninterruptible power supply system 61 further includes electromagnetic contactors 62, 68, 74, current detectors 63, 71, CT1, CT2, capacitors 64, 69, 73, reactors 65, 72, a converter 66, a bidirectional chopper 67, inverter 70, semiconductor switch 1, an operation unit 75, a controller 76, and notifying unit 4.

Electromagnetic contactor 62 and reactor 65 are connected in series between AC input terminal T1 and the input node of converter 66. Capacitor 64 is connected to a node N1 between electromagnetic contactor 62 and reactor 65. Electromagnetic contactor 62 is turned on at the time of use of uninterruptible power supply system 61, and is turned off at the time of, for example, the maintenance of uninterruptible power supply system 61.

The instantaneous value of an AC input voltage Vi appearing at node N1 is detected by controller 76. Based on the instantaneous value of AC input voltage Vi, the presence or absence of a power failure of commercial AC power supply 5 is determined, for example. Current detector 63 detects an AC input current Ii flowing through node N1, and provides a signal Iif indicating the detection value to controller 76.

Capacitor 64 and reactor 65 constitute a low-pass filter. The low-pass filter allows AC power having a commercial frequency from commercial AC power supply 5 to pass to converter 66, and prevents a signal having a switching frequency generated at converter 66 from passing to commercial AC power supply 5.

Converter 66 is controlled by controller 76 so that, at the time of normal supply in which AC power is supplied from commercial AC power supply 5, converter 66 converts the AC power into DC power and outputs the DC power to a DC line DL1; and at the time of a power failure in which the supply of AC power from commercial AC power supply 5 is stopped, the operation of converter 66 is stopped. The output voltage from converter 66 can be controlled into a desired value. Capacitor 64, reactor 65, and converter 66 constitute a rectification device.

Capacitor 69 is connected to DC line DL1 and smooths the voltage in DC line DL1. The instantaneous value of DC voltage VDC appearing in DC line DL1 is detected by controller 76. Bidirectional chopper 67 has a high-voltage node connected to DC line DL1, and a low-voltage node connected to battery terminal T3 via electromagnetic contactor 68.

Electromagnetic contactor 68 is turned on at the time of use of uninterruptible power supply system 61, and is turned off at the time of, for example, the maintenance of uninterruptible power supply system 61 and battery 52. The instantaneous value of a voltage VB between the terminals of battery 52 appearing at battery terminal T3 is detected by controller 76.

Bidirectional chopper 67 is controlled by controller 76 so that, at the time of normal supply in which AC power is supplied from commercial AC power supply 5, bidirectional chopper 67 supplies DC power generated by converter 66 to battery 52 for storage therein; and at the time of a power failure in which the supply of AC power from commercial AC power supply 5 is stopped, bidirectional chopper 67 supplies DC power from battery 52 to inverter 70 via DC line DL1.

When bidirectional chopper 67 supplies DC power to battery 52 for storage therein, bidirectional chopper 67 steps down DC voltage VDC in DC line DL1 and provides the stepped-down voltage to battery 52. When bidirectional chopper 67 supplies DC power from battery 52 to inverter 70, bidirectional chopper 67 boosts voltage VB between the terminals of battery 52 and outputs the boosted voltage to DC line DL1. DC line DL1 is connected to the input node of inverter 70.

Inverter 70 is controlled by controller 76, so that inverter 70 converts DC power supplied from converter 66 or bidirectional chopper 67 via DC line DL1 into AC power having a commercial frequency, and outputs the AC power. Specifically, at the time of normal supply from commercial AC power supply 5, inverter 70 converts DC power supplied from converter 66 via DC line DL1 into AC power; and at the time of a power failure of commercial AC power supply 5, inverter 70 converts DC power supplied from battery 52 via bidirectional chopper 67 into AC power. The output voltage from inverter 70 can be controlled into a desired value.

Inverter 70 has an output node connected to one terminal of reactor 72. The other terminal (node N2) of reactor 72 is connected to one terminal of electromagnetic contactor 74. The other terminal (node N3) of electromagnetic contactor 74 is connected to AC output terminal T4 via AC line L2 (second AC line). Capacitor 73 is connected to node N2.

Current detector 71 detects the instantaneous value of an output current Io from inverter 70, and provides a signal Iof indicating the detection value to controller 76. The instantaneous value of an AC output voltage Vo appearing at node N2 is detected by controller 76.

Reactor 72 and capacitor 73 constitute a low-pass filter. The low-pass filter allows AC power having a commercial frequency generated at inverter 70 to pass to AC output terminal T4, and prevents a signal having a switching frequency generated at inverter 70 from passing to AC output terminal T4. Inverter 70, reactor 72, and capacitor 73 constitute an inversion device.

Electromagnetic contactor 74 is controlled by controller 76 so that, during an inverter power feeding mode in which load 6 is supplied with AC power generated by inverter 70, electromagnetic contactor 74 is turned on; and during a bypass power feeding mode in which load 6 is supplied with AC power from bypass AC power supply 7, electromagnetic contactor 74 is turned off.

Current detector CT2 (second current detector) detects the instantaneous value of load current I2 flowing through AC line L2, and provides signal I2f indicating the detection value to controller 76. The instantaneous value of an AC output voltage VL appearing at node N3 is detected by controller 76.

Semiconductor switch 1 has one terminal connected to bypass input terminal T2, and the other terminal connected to node N3 via AC line L1 (first AC line). Semiconductor switch 1 is controlled by controller 76 so that, during the bypass power feeding mode in which load 6 is supplied with AC power from bypass AC power supply 7, semiconductor switch 1 is turned on; and during the inverter power feeding mode in which load 6 is supplied with AC power generated by inverter 70, semiconductor switch 1 is turned off.

Semiconductor switch 1 includes a pair of thyristors 1a, 1b connected in antiparallel to each other. Thyristor 1a has an anode connected to one terminal of semiconductor switch 1, and a cathode connected to the other terminal of semiconductor switch 1. Thyristor 1b has an anode and a cathode respectively connected to the cathode and the anode of thyristor 1a.

When bypass AC voltage VI appearing at bypass input terminal T2 has a positive polarity, application of a trigger current to the gate of thyristor 1a causes thyristor 1a to be fired (turned on). When bypass AC voltage VI becomes 0 V after that, thyristor 1a is extinguished (turned off). When bypass AC voltage VT has a negative polarity, application of a trigger current to the gate of thyristor 1b causes thyristor 1b to be fired (turned on). When bypass AC voltage VI becomes 0 V after that, thyristor 1b is extinguished (turned off).

When a trigger current is applied to the gates of thyristors 1a, 1b alternately in synchronization with bypass AC voltage VI, thyristors 1a, 1b are alternately fired, thereby turning on semiconductor switch 1. When the supply of trigger current to the gates of thyristors 1a, 1b is stopped, thyristors 1a, 1b are extinguished, thereby turning off semiconductor switch 1.

The instantaneous value of bypass AC voltage VI appearing at bypass input terminal T2 is detected by controller 76. The detection value of bypass AC voltage VI is used to determine the presence or absence of a power failure in bypass AC power supply 7 and to control thyristors 1a, 1b and inverter 70. Current detector CT1 detects the instantaneous value of bypass AC current I1 flowing through AC line L1, and provides signal I1f indicating the detection value to controller 76.

Operation unit 75 includes, for example, a plurality of buttons to be operated by the user of uninterruptible power supply system 61, and an image display that displays various pieces of information. By operating operation unit 75, the user can turn on and off the power supply of uninterruptible power supply system 61, select any one of the bypass power feeding mode and the inverter power feeding mode, and select any one of the automatic operation mode and the manual operation mode.

Controller 76 control the overall uninterruptible power supply system 61 based on, for example, the signal from operation unit 75, AC input voltage Vi, AC input current Ii, DC voltage VDC, battery voltage VB, AC output current Io, AC output voltage Vo, AC output voltage VL, load current I2, bypass AC voltage VI, and bypass AC current I1.

Specifically, controller 76 determines whether or not a power failure of commercial AC power supply 5 has occurred, based on the detection value of AC input voltage Vi, and controls converter 66 based on AC input voltage Vi, AC input current Ii, and DC voltage VDC.

At the time of normal supply in which AC power is supplied from commercial AC power supply 5, controller 76 controls converter 66 so that DC voltage VDC will be a desired target voltage VDCT. At the time of a power failure in which the supply of AC power from commercial AC power supply 5 is stopped, controller 76 stops the operation of converter 66.

Further, at the time of normal supply from commercial AC power supply 5, controller 76 controls bidirectional chopper 67 so that battery voltage VB will be a desired target battery voltage VBT. At the time of a power failure of commercial AC power supply 5, controller 76 controls bidirectional chopper 67 so that DC voltage VDC will be a desired target DC voltage VDCT.

Further, controller 76 determines whether or not a power failure has occurred in bypass AC power supply 7, based on the detection value of bypass AC voltage VI. At the time of normal supply from bypass AC power supply 7, controller 76 selects and executes the bypass power feeding mode in which load 6 is supplied with AC power from bypass AC power supply 7. At the time of a power failure of bypass AC power supply 7, controller 76 selects and executes the inverter power feeding mode in which load 6 is supplied with AC power from inverter 70.

During the bypass power feeding mode, controller 76 turns off electromagnetic contactor 74, and alternately fires thyristors 1a, 1b in synchronization with bypass AC voltage VI, thereby turning on semiconductor switch 1. Thus, load current I2 is supplied to load 6 from bypass AC power supply 7 via semiconductor switch 1 and AC lines L1, L2, so that load 6 is driven.

Controller 76 also controls inverter 70 based on bypass AC voltage VI, AC output voltage Vo, and AC output current Io, so that AC output voltage Vo will be in phase with bypass AC voltage VI and so that AC output voltage Vo will be a desired target AC voltage VoT. Inverter 70 is controlled into a standby state.

During the inverter power feeding mode, controller 76 turns on electromagnetic contactor 74, and stops firing thyristors 1a, 1b, thereby turning off semiconductor switch 1. Controller 76 also controls inverter 70 based on bypass AC voltage VI, AC output voltage VL, and load current I2, so that AC output voltage VL will be in phase with bypass AC voltage VI and so that AC output voltage VL will be a desired target AC voltage VLT. Thus, load current I2 is supplied from inverter 70 to load 6 via reactor 72, electromagnetic contactor 74, and AC line L2, so that load 6 is driven.

Further, during the bypass power feeding mode, when bypass AC current I1 increases to above the upper limit, controller 76 determines that an overcurrent has flowed through load 6 and thus turns off semiconductor switch 1. During the bypass power feeding mode, when bypass AC current T1 decreases to below the lower limit, controller 76 determines that a pair of thyristors 1a, 1b included in semiconductor switch 1 have both misfired. Thus, controller 76 stops the bypass power feeding mode and switches to the inverter power feeding mode.

Further, during the bypass power feeding mode, controller 76 determines whether or not thyristors 1a, 1b are normally working, based on output signals I1f, I2f (i.e., the detection values) from current detectors CT1, CT2. When signals I1f, I2f are equal, controller 76 determines that thyristors 1a, 1b are normally working; and when signals I1f, I2f are not equal, controller 76 determines that any one of a pair of thyristors 1a, 1b has misfired.

The method for determining whether or not thyristors 1a, 1b are normally working based on output signals I1f, I2f from current detectors CT1, CT2 is as described in embodiment 1 (FIG. 2 to FIG. 5). Controller 76 has a built-in failure detector 30 (FIG. 5). When thyristors 1a, 1b are normally working, controller 76 sets failure detection signal DT to the "L" level or inactive level; and when any one of a pair of thyristors 1a, 1b has misfired, controller 76 sets failure detection signal DT to the "H" level or active level. Mode signal MID (FIG. 5) is set to the "H" level during the bypass power feeding mode, and to the "L" level during the inverter power feeding mode.

When failure detection signal DT is set to the "H" level or active level, notifying unit 4 notifies to the user of uninterruptible power supply system 61 that any one of a pair of thyristors 1a, 1b of semiconductor switch 1 has misfired, using sound, light, image, text, and the like.

The operation of uninterruptible power supply system 61 will now be described. At the time of normal supply from bypass AC power supply 7, the bypass power feeding mode is performed, in which semiconductor switch 1 is turned on and electromagnetic contactor 74 is turned off. AC power is supplied from bypass AC power supply 7 to load 6 via semiconductor switch 1 and AC lines L1, L2, so that load 6 is operated.

During the bypass power feeding mode, inverter 70 is in a standby state. At the time of normal supply from commercial AC power supply 5, AC power from commercial AC power supply 5 is converted into DC power by converter 66. The DC power is supplied via bidirectional chopper 67 to battery 52 to be stored in battery 52, and is also supplied to inverter 70 to be converted into AC power by inverter 70. At the time of a power failure of commercial AC power supply 5, DC power from battery 52 is supplied to inverter 70 via bidirectional chopper 67 and is converted into AC power by inverter 70.

At the time of a power failure of bypass AC power supply 7, the mode is switched from the bypass power feeding mode to the inverter power feeding mode, so that semiconductor switch 1 is turned off and electromagnetic contactor 74 is turned on. Thus, AC power is supplied to load 6 from inverter 70 via reactor 72, electromagnetic contactor 74, and AC line L2, thereby allowing load 6 to continue operating.

During the bypass power feeding mode, when at least one of thyristors 1*a*, 1*b* of semiconductor switch 1 has misfired, biased magnetization occurs in iron core 10*a* of transformer 10 included in current detector CT1 (FIG. 2), resulting in an increase in the absolute value of voltage Vs of the difference between output signals I1*f*, I2*f* from current detectors CT1, CT2 (FIG. 4 (A) to (D)). When Vs>VTP or Vs<VTN is satisfied, failure detector 30 (FIG. 5) sets failure detection signal DT to the "H" level or active level.

When failure detection signal DT is set to the "H" level and inverter 70 is normally working, controller 76 switches the mode from the bypass power feeding mode to the inverter power feeding mode. When failure detection signal DT is set to the "H" level but inverter 70 is failed, controller 76 continues the bypass power feeding mode. When failure detection signal DT is set to the "H" level, notifying unit 4 notifies to the user of uninterruptible power supply system 61 that any one of thyristors 1*a*, 1*b* has misfired.

Embodiment 4 can bring about the same advantageous effects as those of embodiment 1. Note that current detector CT2 is preferably used as a current detector for controlling the AC output current of inverter 70 at the time of a power failure of bypass AC power supply 7. This is because current detector CT2 (HCT), free from biased magnetization, can more accurately detect the current than current detector CT1 (ACCT) having possible biased magnetization. Therefore, current detector CT2 is preferably used to detect the current in AC line L2.

The embodiments disclosed herein should be considered illustrative in all respects, not limitative. The present invention is defined not by the above description but by the terms of the claims, and is intended to include any modification in the meaning and scope equivalent to the terms of the claims.

REFERENCE SIGNS LIST

1, 41, 45: semiconductor switch; 1*a*, 1*b*: thyristor; 2, 75: operation unit; 3, 42, 53, 76: controller; 4: notifying unit; L1, L2: AC line; 5: commercial AC power supply; 6: load; 7: bypass AC power supply; 10: transformer; 10*a*: iron core; 10*b*: primary winding; 10*c*: secondary winding; 11: resistive element; 20: Hall effect sensor; 20*a*: semiconductor chip; 20*b*, 20*c*: current terminal; 20*d*, 20*e*: voltage terminal; 21: constant-current source; 22: differential amplifier; 30: failure detector; 31: subtractor; 32, 33: comparator; 34: OR gate; 35: AND gate; Q1, Q2: IGBT, D1, D2: diode; 51: AC-DC conversion device; 52: battery; 61: uninterruptible power supply system; T1: AC input terminal; T2: bypass input terminal; T3: battery terminal; T4: AC output terminal; 62, 68, 74: electromagnetic contactor; 63, 71, CT1, CT2: current detector; 64, 69, 73: capacitor; 65, 72: reactor; 66: converter; 67: bidirectional chopper; 70: inverter; DL1: DC line

The invention claimed is:

1. A power supply system comprising:
   a semiconductor switch having a first terminal that receives AC power from a first AC power supply, and a second terminal connected to a load;
   a first current detector and a second current detector each of which detects an instantaneous value of a current flowing through the semiconductor switch, and outputs a signal indicating a detection value,
   the semiconductor switch including a first semiconductor element through which a current having a first polarity flows, and a second semiconductor element through which a current having a second polarity flows,
   the first current detector including a transformer that outputs an electrical signal having a value corresponding to a current detected by the first current detector,
   the second current detector including a magnetoelectric transducer that converts a magnetic field into an electrical signal, the magnetic field being generated by a current detected by the second current detector; and
   a failure detector that, when the detection values from the first and second current detectors are not equal, outputs a failure detection signal indicating that a current is not flowing through any one of the first and second semiconductor elements.

2. The power supply system according to claim 1, wherein the first semiconductor element includes a first thyristor, and the second semiconductor element includes a second thyristor, and
the first and second thyristors are connected in antiparallel to each other between the first and second terminals.

3. The power supply system according to claim 1, wherein the first semiconductor element includes a first transistor, and the second semiconductor element includes a second transistor,
a first electrode of the first transistor is connected to a first electrode of the second transistor, a second electrode of the first transistor is connected to the first terminal, and a second electrode of the second transistor is connected to the second terminal,
the semiconductor switch further includes a first diode and a second diode, and
the first diode is connected in antiparallel to the first transistor, and the second diode is connected in antiparallel to the second transistor.

4. The power supply system according to claim 1, wherein the magnetoelectric transducer includes a Hall effect sensor.

5. The power supply system according to claim 1, wherein
when the first and second semiconductor elements are normally working, the detection values from the first and second current detectors are equal, and
when a current is not flowing through any one of the first and second semiconductor elements, a DC component is superimposed on the signal outputted from the transformer due to biased magnetization, so that the detection values from the first and second current detectors are not equal.

6. The power supply system according to claim 5, wherein the failure detector includes
a subtractor that calculates a difference between the detection values from the first and second current detectors, and
a signal generator that outputs the failure detection signal when the difference goes out of a prescribed range.

7. The power supply system according to claim 1, further comprising a notifying unit that notifies that a current is not flowing through any one of the first and second semiconductor elements, in response to the failure detection signal outputted from the failure detector.

8. The power supply system according to claim 1, wherein the semiconductor switch is turned on in a first case in which an AC voltage from the first AC power supply is normal, and the semiconductor switch is turned off in a second case in which the AC voltage from the first AC power supply is not normal, in the first case, the failure detector outputs the failure detection signal when the detection values from the first and second current detectors are not equal, and the power supply system further comprises an inversion device that converts DC power supplied from a DC power supply into AC power and supplies the AC power to the load in the second case.

9. The power supply system according to claim 1, wherein the semiconductor switch is turned on in a first case in which an AC voltage from the first AC power supply is normal, and the semiconductor switch is turned off in a second case in which the AC voltage from the first AC power supply is not normal, in the first case, the failure detector outputs the failure detection signal when the detection values from the first and second current detectors are not equal, the power supply system further comprises:
- a rectification device that converts AC power supplied from a second AC power supply into DC power in a third case in which an AC voltage from the second AC power supply is normal; and
- an inversion device that converts DC power into AC power and supplies the AC power to the load, in the third case, DC power generated by the rectification device is supplied to the inversion device, and is also stored in a power storage unit, and in a fourth case in which the AC voltage from the second AC power supply is not normal, DC power from the power storage unit is supplied to the inversion device.

10. The power supply system according to claim 9, further comprising:
- an electromagnetic contactor having one terminal that receives AC power from the inversion device, the electromagnetic contactor being turned on in the second case;
- a first AC line connected between another terminal of the semiconductor switch and another terminal of the electromagnetic contactor; and
- a second AC line connected between the other terminal of the electromagnetic contactor and the load, wherein the first current detector detects a current flowing through the first AC line, and the second current detector detects a current flowing through the second AC line.

11. The power supply system according to claim 10, further comprising a controller, wherein
in the first case, the controller turns on the semiconductor switch and turns off the electromagnetic contactor, and
in the second case, the controller turns off the semiconductor switch and turns on the electromagnetic contactor.

12. The power supply system according to claim 11, wherein
when the failure detection signal is outputted from the failure detector in the first case,
when the inversion device is normal, the controller turns off the semiconductor switch and turns on the electromagnetic contactor, and
when the inversion device is failed, the controller maintains an on-state of the semiconductor switch and an off-state of the electromagnetic contactor.

13. The power supply system according to claim 10, further comprising a controller that controls the inversion device based on the detection value from the second current detector in the second case.

* * * * *